United States Patent [19]
Ferguson et al.

[11] Patent Number: 5,932,377
[45] Date of Patent: Aug. 3, 1999

[54] EXACT TRANSMISSION BALANCED ALTERNATING PHASE-SHIFTING MASK FOR PHOTOLITHOGRAPHY

[75] Inventors: Richard A. Ferguson, Pleasant Valley; Lars W. Liebmann, Poughquag; Scott M. Mansfield, Hopewell Junction, all of N.Y.; David S. O'Grady, Jericho, Vt.; Alfred K. Wong, Beacon, N.Y.

[73] Assignee: International Business Machines Corporation, Armonk, N.Y.

[21] Appl. No.: 09/028,833

[22] Filed: Feb. 24, 1998

[51] Int. Cl.[6] .................................................. G03F 9/00
[52] U.S. Cl. .................................................. 430/5; 430/22
[58] Field of Search .................................. 430/5, 22, 322, 430/323

[56] References Cited

PUBLICATIONS

Kostelak, et al, Explosure Characteristics of Alternate Aperture Phase–Shifting Mask Fabricated Using a Subtractive Process J. Vac. Sci, Technol. B (10)6, Nov./Dec. 1992, pp. 3055–3061.

Wong, et al, Mask Topography Effects In Projection Printing of Phase–Shifting Masks IEEE Transactions on Electron Devices, v. 41, No. 6, Jun. 1994, pp. 895–902.

Chieu, et al, Fabrication of Phase Shifting Mask Employing Multi–Layer Films Proceedings SPIE, vol. 2197, 1994, pp. 181–193.

Ferguson, et al, Pattern–Dependent Correction of Mask Topography Effects For Alternating Phase–Shifting Masks Proceedings of SPIE, vol. 2440, 1995, pp. 349–360.

*Primary Examiner*—S. Rosasco
*Attorney, Agent, or Firm*—H. Daniel Schnurmann

[57] ABSTRACT

A two-step method for eliminating transmission errors in alternating phase-shifting masks is described. Initially, the design data is selectively biased to provide a coarse reduction in the inherent transmission error between features of different phase, size, shape, and/or location. During fabrication of the mask with the modified data, residual transmission errors are then eliminated via the positioning of the edges of the etched-quartz trenches which define the phase of a given feature to a set location beneath the opaque chrome film. Application of feedback, in which the aerial image of the mask is monitored during the positioning of the etched-quartz edges, provides additional and precise control of the residual transmission error.

22 Claims, 9 Drawing Sheets

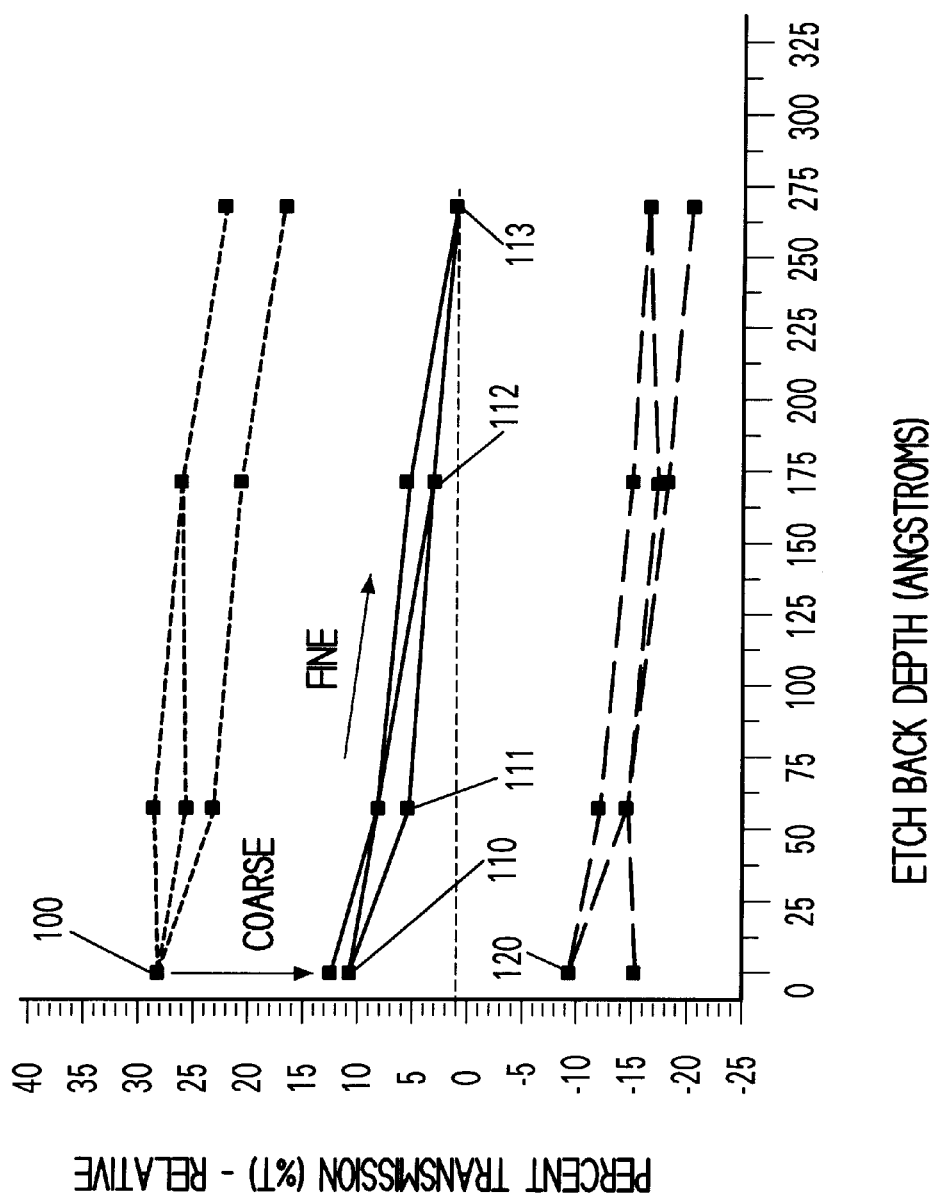

EXACT TRANSMISSION BALANCED ALTERNATING PHASE-SHIFTING MASK FOR PHOTOLITHOGRAPHY

FIELD OF THE INVENTION

This invention relates generally to optical photolithography, and more particularly to a method for balancing the transmission of light through features of different phase on alternating phase-shifting masks.

BACKGROUND OF THE INVENTION

In the photolithography step of integrated circuit manufacturing, a template containing a designed set of clear and dark shapes, referred to as a mask or reticle, is repeatedly printed on the surface of a silicon wafer via optical imaging. The minimum resolution R, defined herein as the smallest center-to-center separation for which two individual objects can be resolved on the wafer (also referred to as the minimum resolvable pitch), is given by the expression:

$$R = 2 \times k1 \times (\lambda/NA), \quad (1)$$

wherein NA is the numerical aperture of the optical projection system (hereinafter referred to as the stepper) and $\lambda$ is the wavelength of the light used by the stepper. For partially coherent imaging, the theoretical limit for the resolution, as defined above, occurs at a k1 factor of:

$$k1 = 1/[2 \times (1+\sigma)], \quad (2)$$

wherein $\sigma$ is the partial coherence factor of the stepper.

In standard industry practice as outlined in the schematic mask cross-section of FIG. 1, masks containing the desired opaque and clear patterns are fabricated starting from an initial mask blank (FIG. 1A) consisting of a substrate which is transparent to the imaging light 10 and which is coated on one side with an opaque film 20. Typically, the transparent substrate is composed of fused silica (also known as quartz), hereinafter referred to as the quartz substrate, while the transparent substrate material will be referred to as quartz. In addition, the opaque film is typically composed of a chromium-based material to be referred to as the chrome film, while the material of the film itself will be referred to as chrome. The designed shapes are replicated on this mask blank by first selectively patterning (or writing) the designed shapes in a protective material sensitive to electrons or optical exposure (FIG. 1B), and which will be referred to as resist 30. The openings created in the resist via selective patterning 35 are then transferred to the underlying chrome film during a subsequent etch step such that following removal of the resist material (FIG. 1C), the designed clear shapes 40 and opaque shapes 21 are replicated in the final patterned mask. Masks fabricated in this fashion will be referred to hereinafter as standard or chrome-on-glass (COG) masks.

A different class of masks, such as a phase-shifting mask (PSM), has demonstrated the capability of extending resolution beyond conventional imaging limits by taking advantage of both the phase and the intensity of the imaging light. If two clear shapes which transmit light of opposite phases (180° phase difference) are moved in close proximity to each other, the phase difference will produce a destructive interference null between the two shapes. Such a mask has been given several different designations in the literature such as: Levenson, Levenson-Shibuya, phase edge, alternating aperture, or alternating mask. Herein, it will be referred to as an alternating mask or as an alternating PSM. With this alternating PSM approach, the theoretical resolution limit is reduced to:

$$k1 = 1/[4 \times (1+\sigma)] \quad (3)$$

or one-half the resolution of conventional imaging.

The additional mask fabrication steps beyond the standard mask process of FIG. 1 are shown for an etched-quartz or subtractive alternating PSM process in FIG. 2. A phase difference between two clear shapes for an alternating PSM is achieved in standard industry practice by selectively etching into the quartz substrate 10, such that an optical path difference equivalent to the desired phase offset is obtained between two adjacent openings. Following a standard mask patterning as shown in FIG. 1, a second write step is used to selectively open a protective resist coating 50 for the phase-shifted opening 41 leaving the non-phase shifted opening 42 covered, as shown in FIG. 2A. In practice, it is desirable to locate the edges of the resist pattern 55 some distance away from the phase-shifted opening 41 on top of the opaque chrome shapes 21 where appropriate, in order to use the chrome itself as an etch barrier and account for overlay (or pattern placement) errors between the first and second-level write steps in the fabrication process. The quartz is then etched (typically, with an anisotropic reactive-ion etch (RIE) process) to a depth of approximately:

$$\text{etch depth} = \text{phase} \times /[2 \times \lambda \times (n-1)], \quad (4)$$

wherein n is the refractive index of the quartz substrate, and the phase of the opening 41 is given in radians. Following removal of the resist 50, the resultant alternating PSM has, as shown in FIG. 2B, the etched-quartz trench 15 providing the desired phase difference between adjacent openings 41 and 42.

More complex fabrication approaches have been proposed for accurately controlling the phase (as determined by equation 4) through the addition of multi-layer films to the transparent substrate. By way of example, T. Chieu et al., in the article "Fabrication of Phase Shifting Masks Employing Multi-Layer Films," Proc. SPIE, Vol. 2197, pp. 181–193, (1994) describe a mask blank wherein two additional layers are added between the transparent quartz substrate and the opaque chrome: an etch stop layer composed of either $Al_2O_3$ or $HfO_2$, and a transparent layer of silicon dioxide at a controlled thickness given by equation (4). The desired phase is then achieved by etching into the $SiO_2$ until the etch stop layer is reached.

The invention to be described herein is applicable to both dark-field and bright-field patterns which are defined in FIG. 3. In prior-art dark-field designs (a majority of the area is designed to be opaque on the mask), the closed shapes within the design (i.e., polygons of any number of vertices and edges, although rectangles are used herein for simplicity) typically represent clear openings in the chrome of the mask, shown by 41 and 42 in the cross-section of FIG. 2B and in the design data of FIG. 3A. In addition, for an alternating PSM, the openings which are to receive the quartz etch required to establish phase 41 are typically indicated by including a surrounding shape that corresponds to the second writing step in the fabrication process, shown by edge 55 in the cross-section of FIG. 2A and by shape 55 in FIG. 3A. For bright-field designs, an example of which is shown in FIG. 3B, (a majority of the area is designed to be transparent on the mask), the closed shapes within the design typically represent remaining regions of opaque chrome as represented by the chrome features 21 in the cross-section of FIG. 2B and the rectangles 21 in the design data of FIG. 3B; the clear openings in the chrome such as 41 and 42 in the cross-section of FIG. 2B are then given by the spaces between the designed shapes 41 and 42 in the design data of FIG. 3B. With a bright-field alternating PSM, the shapes describing the second-level write step for defining the areas for the phase etch 55 in both FIGS. 2B and 3B, will both overlap the designed chrome shapes as well as contain bare edges within the clear areas of the design 56, as shown in FIG. 3B. These bare phase edges may print as a narrow dark line which may require subsequent removal via techniques well known to those skilled in the art, such as the use of a second (trim) mask. The basic principles of this patent are unaffected by the specific technique chosen to remove the residual phase edge in bright-field alternating PSM lithography.

The fabrication process illustrated in FIG. 2 has proven to yield non-ideal results when used to photolithographically image such mask patterns into the photo-sensitive resist (also known as photoresist) on the wafer substrate. The ideal results obtained from printing the mask of FIG. 2B are shown schematically in FIG. 4A. The photoresist 63 on wafer substrate 60 contains two equally-sized openings 61 and 62 corresponding to the clear openings on masks 41 and 42. (Note that for illustrative purposes, a positive photoresist in which the photo-sensitive material is removed in areas that are exposed to light is assumed, although the invention is applicable to negative photoresist as well). In practice, however, it has been conclusively demonstrated that the edges of the etched-quartz trenches 15 of an alternating PSM scatter the incident illumination. This, in turn, leads to a reduced intensity being transmitted through the phase-shifted mask opening 41 (in FIG. 2b) relative to that transmitted through the non-phase-shifted mask opening 42 (in FIG. 2b) during the photolithographic exposure. The asymmetric printing of the desired pattern that results from this transmission error is schematically illustrated in FIG. 4B, wherein the resultant photoresist opening 71 corresponding to the phase-shifted mask opening 41 is undersized in comparison to the adjacent photoresist opening 72 corresponding to the non-phase-shifted mask opening 42. In conjunction with the dimensional error, the center of the photoresist pattern between the two openings 73 has shifted to the right resulting in a pattern placement error as well. The impact of sidewall scattering on transmission error has been substantiated both through simulations of electromagnetic scattering via rigorous solution of Maxwell's equations and through experimental verification as described in an article by R. Kostelak et al., published in the Journal of Vacuum Science and Technology B, Vol. 10(6), pp. 3055–3061, (1992).

Several methods have been described to correct this transmission error. A summary and detailed analysis of these approaches can be found in an article entitled: "Pattern-Dependent Correction of Mask Topography Effects for Alternating Phase-Shifting Masks", by R. A. Ferguson, et al., published in the Proceedings of SPIE, Vol. 2440, pp. 349–360, (1995). Two approaches are discussed herein as relevant prior art to this invention. The first technique, as described schematically in FIG. 5A uses a quartz etch-back process to alleviate the transmission error. Following the standard processing sequence illustrated in FIGS. 1 and 2, the reticle is subjected to an isotropic etch (e.g., immersion in dilute Hf solution) in which the sidewalls of the etched quartz trench 15 are recessed beneath the chrome film 22. The non-phase-shifted opening is also etched simultaneously in this manner such that the relative phase difference as defined by equation (4) remains constant. While this process has been effective at reducing the transmission error, rigorous simulations indicate that complete removal of the transmission error cannot be attained as described in the aforementioned article by R. Ferguson et al. In addition, the overhang of the chrome as indicated by 22 in FIG. 5A can become significantly large (e.g., in excess of 1000 Å), rendering the physical stability of the overhanging chrome questionable under standard manufacturing conditions. This is especially true when the mask undergoes vigorous cleaning procedures that are standard and an essential component of producing and maintaining zero-defect, manufacturing-quality masks.

In a second approach described by A. Wong and A. Neureuther in the article entitled "Mask Topography Effects in Projection Printing of Phase-Shifting Masks", published in IEEE Transactions on Electron Devices, Vol. 40, No. 6, pp. 895–902, (1994), the initial design data (FIG. 3) is manipulated prior to mask fabrication such that when it is coupled to the standard fabrication process of FIGS. 1 and 2, the mask shown schematically in FIG. 5B is obtained. In the aforementioned design modifications, the phase-shifted opening 41 has been enlarged by a preset bias relative to the non-phase-shifted opening 42 in order to increase the transmitted light through the phase-shifted opening 41 and, thus, compensate for the transmission loss from side-wall scattering from the edges of the etched-quartz trench 15. In theory, this approach can fully compensate for the scattering phenomena when the design bias is continuously adjustable. In practice, however, the range of allowable biases is limited to discrete values on a coarse grid (referred to hereinafter as the design grid). While a reduction in the step size of this finite design grid will provide more ideal characteristics, the lower bound that is placed on the step size of the design grid by the writing tool used to pattern the mask limits this technique to unacceptably large residual transmission errors as described in the aforementioned article by R. Ferguson et al.

OBJECTS OF THE INVENTION

Accordingly, it is an object of the present invention to eliminate transmission errors of an alternating PSM caused by an intensity reduction as light passes through a phase-shifted feature upon exposure.

It is another object of the invention to eliminate the dimensional and pattern-placement errors on the wafer which occur during photolithographic patterning of an alternating PSM having transmission errors.

It is still another object of the invention to maintain a proper balance in a transmission over a wide range of exposures and focus variations experienced under standard manufacturing conditions.

It is yet another object of the invention to provide a standardized, manufacturable process for fabricating alternating PSMs.

SUMMARY OF THE INVENTION

The invention consists of a two step approach for the elimination of transmission errors in alternating PSMs. The first step is performed on the design data itself by selectively biasing the designed shapes in the data in order to provide a coarse reduction in the inherent transmission error present between phase-shifted and non-phase-shifted features. Subsequent removal of the residual transmission error occurs during the mask fabrication process using the biased data, wherein the edges of the etched-quartz trench defining the phase-shifted feature are moved to a position beneath the chrome film at which the transmissions of the phase-shifted and non-phase-shifted features are balanced. Application of feedback during the fabrication process, which includes techniques such as direct aerial image measurements with optical parameters to emulate the photolithographic stepper, provide additional and precise control on the edge location of the etched-quartz trench.

Additional features and benefits of the present invention will become apparent from the detailed description, figures, and claims set forth below.

BRIEF DESCRIPTION OF THE DRAWINGS

While the specification concludes with claims particularly pointing out and distinctly claiming what is regarded as the present invention, details of a preferred embodiment of the invention may be more readily ascertained from the technical description when read in conjunction with the accompanying drawings, wherein:

FIG. 7 shows a plot displaying the resultant transmission error obtained from applying both the coarse design data adjustment and the fine etch-back adjustment in accordance with the present invention, as determined by an aerial image measurements system (AIMS) with optical parameters set to match the stepper exposure condition;

PREFERRED EMBODIMENTS OF THE INVENTION

The invention described herein combines elements of two approaches for reducing the transmission error of an alternating PSM in a novel fashion. It provides a conceptual coarse and fine adjustment that completely eliminates the transmission error, without incorporating the disadvantages of prior art techniques, as described in the background of the invention. A representative schematic of the final mask is shown in FIG. 6.

Figure 4A:
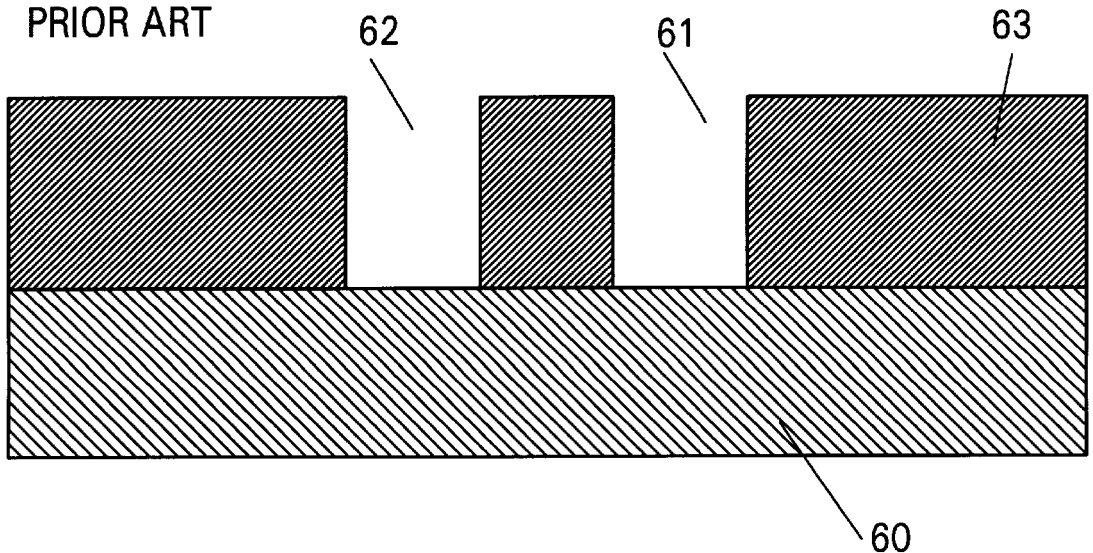
FIG. 4a is a schematic cross-section of a conventional ideal photoresist image patterned on the wafer substrate via photolithographic imaging of an alternating PSM.
Figure 4B:
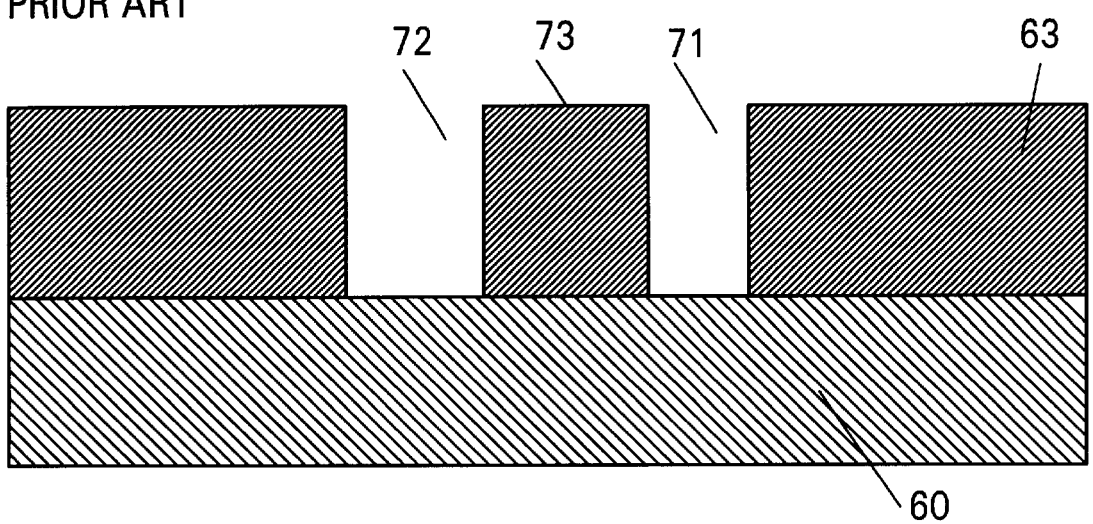
FIG. 4b is a schematic cross-section of a prior art photoresist image patterned on the wafer substrate via photolithographic imaging of an alternating PSM having a transmission error.

For convenience of description, features (i.e., openings) on the mask will nominally be referred to as phase-shifted and non-phase-shifted, as were previously described in the Background of the Invention. It will be appreciated by those skilled in the art that this nomenclature is not intended to associate an actual phase value (or lack thereof) with either of the features described herein. This simplified nomenclature is used instead to indicate that there is a phase-difference between the two features for which the transmission is to be balanced, and that this phase difference may be achieved in practice by etching the quartz substrate for one or both of these features in order to maintain the phase relationship as described by equation 4. In addition, in the examples which demonstrate the applicability of the invention, the phase-shifted and non-phase-shifted features are shown to be of equal size, and the transmission error is considered to be eliminated when equal intensities are transmitted through both openings, thus achieving the symmetrically printed pattern on the wafer, as illustrated in FIG. 4a. Practitioners in the art will readily appreciate that the applicability of this invention to equally-sized openings is only a specialized case. In fact, for purposes of this invention, the phase-shifted and/or non-phase-shifted shapes may be of arbitrary size, shape, and/or desired intensity level. Furthermore, the transmission error is considered to be eliminated when the appropriate intensity is transmitted by each shape in order to print the desired features on the wafer.

Figure 5B:
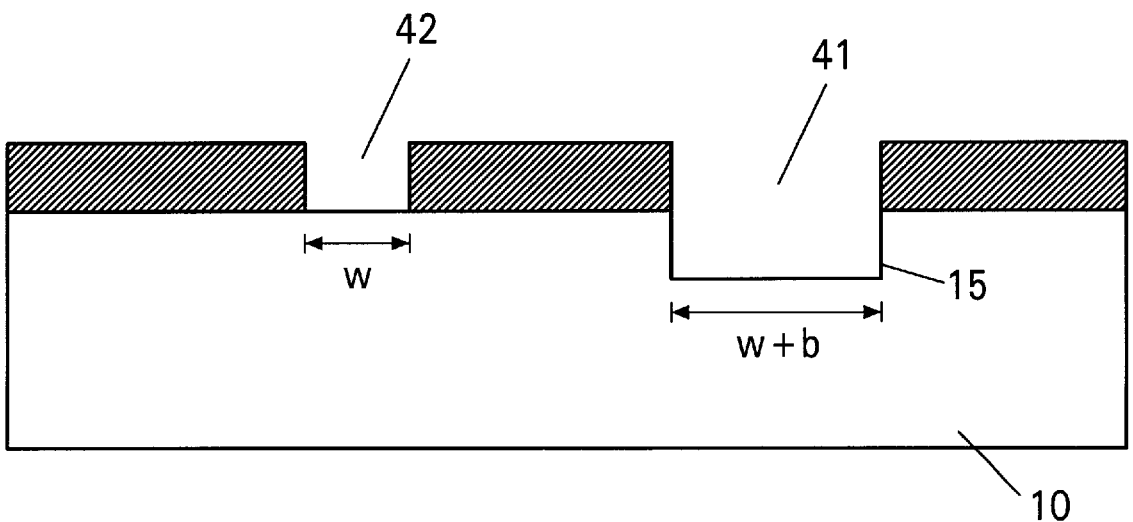
FIG. 5b shows a schematic cross-section of a prior art design biasing method for transmission error correction in an alternating PSM.
Figure 6:
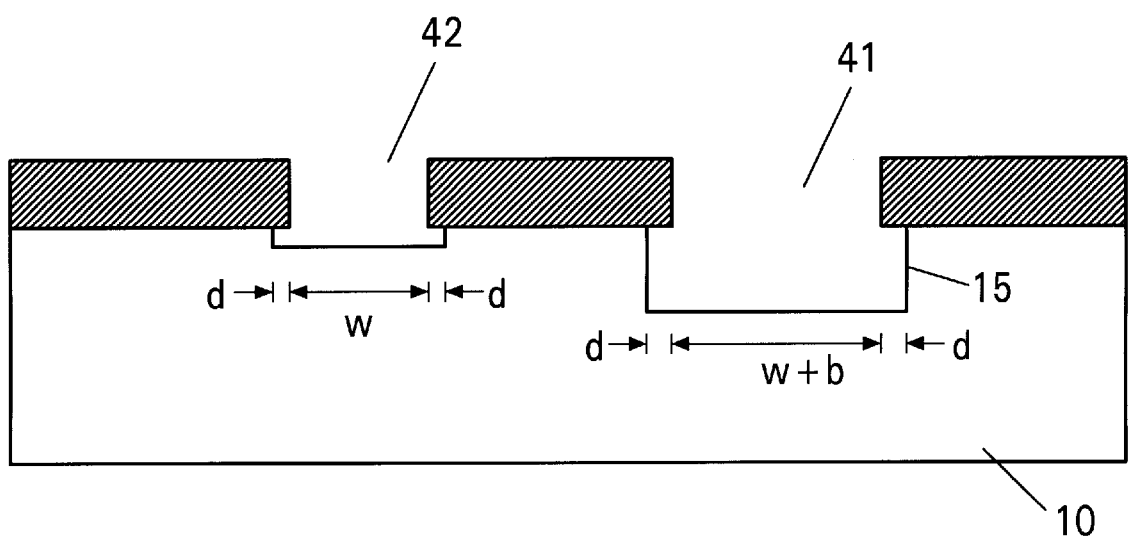
FIG. 6 shows a schematic cross-section of an alternating PSM, fabricated in accordance with the present invention.

A key aspect of the invention, the coarse adjustment, is provided by applying a partially-correcting bias between the phase-shifted 41 and the non-phase-shifted shapes 42 in the design data, as indicated by dimension "b" in FIG. 6. This bias is used to increase the amount of light transmitted through the phase-shifted opening 41 relative to the non-phase-shifted opening 42, but as a consequence of the limitations associated with the discrete design grid, as described in the prior art FIG. 5B, this bias is used only to partially reduce the inherent transmission error.

Figure 5A:
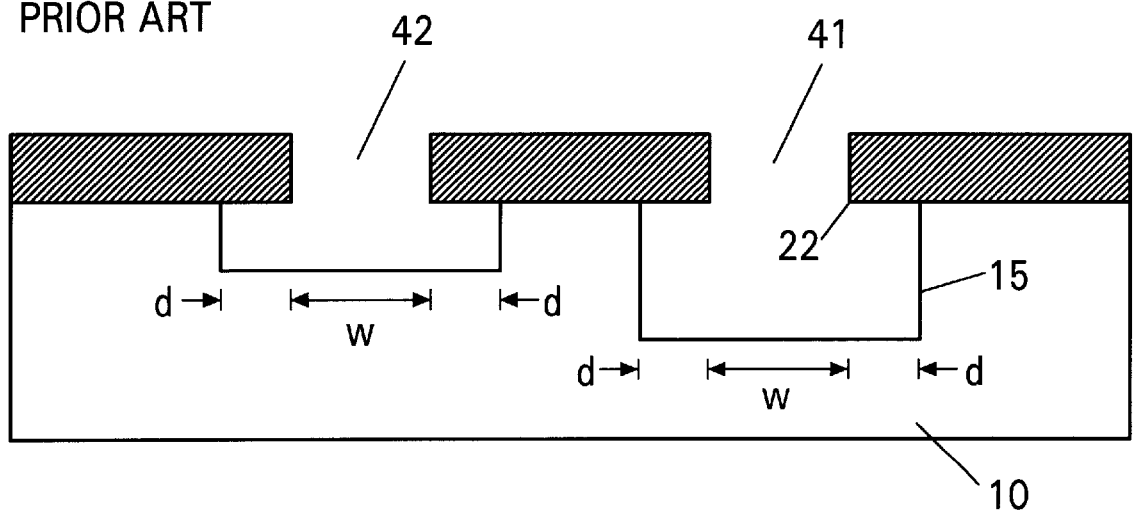
FIG. 5a shows a schematic cross-section of a prior art etch-back method for transmission error correction in an alternating PSM.

The fine adjustment of this invention occurs during mask fabrication, wherein an etch-back process similar to the prior art isotropic etch of FIG. 5A is used to eliminate the residual transmission error that was not corrected for as a result of the biasing. Since the isotropic etch in this process is used for finely tuning the transmission error, the extent of the etch back, given by dimension "d" in FIG. 6, is substantially smaller than that required by the prior art etch-back process of FIG. 5A.

Referring now to FIG. 7, the representative data shown therein further illustrates the methodology used in this invention. The transmission error between two adjacent features of opposite phase is quantified in the plot shown in FIG. 7 as a function of the coarse tuning via biasing of the design data (curve-to-curve variation) and fine tuning with the etch-back process (change in transmission error along one curve). A transmission error of 0% is the ideal value at which the two features are completely balanced. In FIG. 7, data point 100 represents the transmission error (approximately 28%) when no coarse or fine adjustments are applied. A displacement along the y-axis (etch back depth=0 nm) from data point 100 represents a change in transmission error from the coarse bias adjustment. For the design grid size of 25 nm used in this example, the effect of a coarse adjustment of one grid unit is to reduce the transmission error to 10% (i.e., at data point 110). For a two-grid step bias of 50 nm, the transmission error is over-corrected at data point 120. Thus, for purposes of the invention as described, biasing the design data by a single grid step of 25 nm to point 110 provides the appropriate coarse adjustment to the transmission error. Three data points 111, 112, and 113 (in FIG. 7) show the effect of varying the etch back depth in order to remove the residual transmission error after completing the coarse adjustment. This so-called fine adjustment of the etch-back depth is, in effect, continuously adjustable through control of the etch time. Arbitrary small transmission errors can thus be achieved through good process control during the etch back or through multiple sampling of the transmission error in order to provide feedback correction during the fine-tuning process (progression from 110 through 113, in FIG. 7). By way of example, point 113 at an etch-back depth of 275 Å has a transmission error of less than 1%.

In the preferred embodiment of this invention, the coarse adjustment used to reduce the transmission error is realized through a computer-aided design (CAD) system in which some or all of the edges of the chrome patterns which define a phase-shifted feature of reduced transmission with respect to a non-phase-shifted feature are moved in a direction which increases the transmission through the phase-shifted feature. A representative procedure for the design manipulations is shown in FIG. 8A for dark-field patterns, and in FIG. 8B, for bright-field patterns.

Figure 8A:
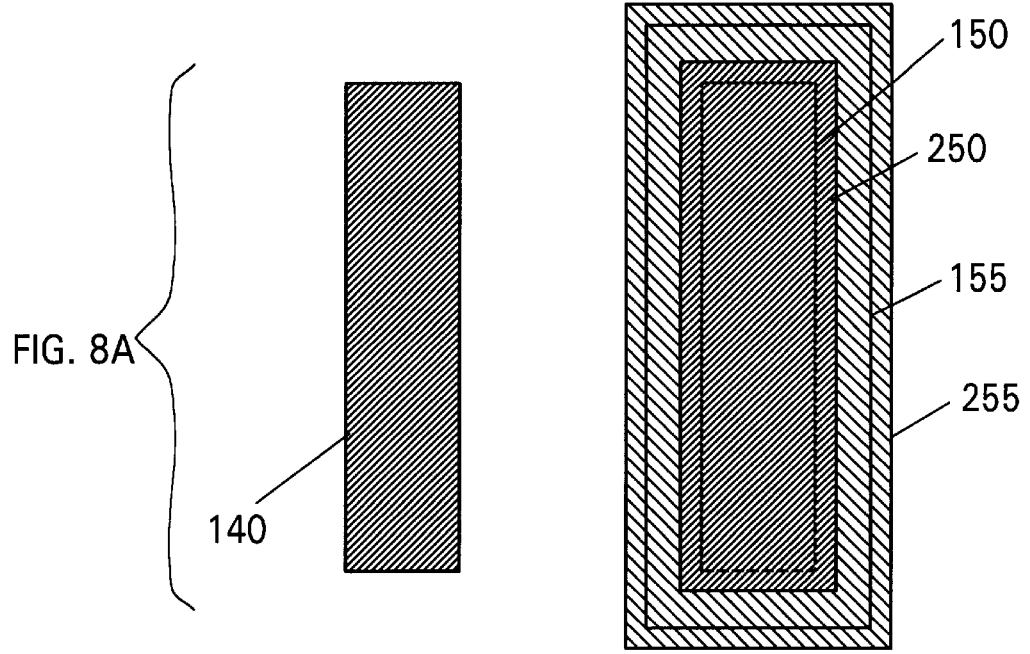
FIG. 8a shows a representative coarse design data adjustment for a dark-field design.
Figure 8B:
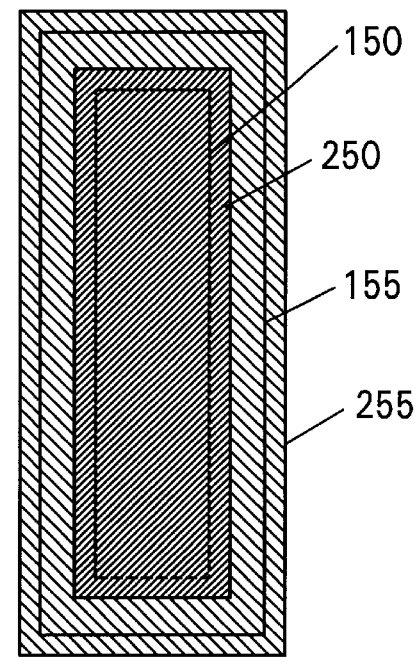
FIG. 8b shows a representative coarse design data adjustment for a bright-field design.

Referring to FIG. 8A, clear shapes 140 and 150 are preferably shown to be of equal size but of different phase, as indicated by the surrounding second-level write phase shape 155. In the design manipulation of this pattern, clear shape 150 is increased in size to become clear shape 250. The corresponding second-level write shape 155 defining the phase of 250 is also increased in size to become phase shape 255. In the bright-field pattern shown in FIG. 8B, chrome shapes 310 and 320 bound non-phase-shifted space 340, while chrome shapes 320 and 330 bound space 350, which is phase-shifted as identified by encompassing second-level write phase shape 360. The coarse bias adjustment is made to increase the size of space 350 by moving the adjacent edge of chrome shape 320 to create chrome shape 420 and by moving adjacent edge of chrome shape 330 to create chrome shape 430. The size of phase shape 360 is correspondingly increased to shape 460.

The amount of any edge bias could, in general, depend on the stepper parameters (λ, NA, σ, etc.), the design grid size, the pattern to be printed (size, shape, distance to adjacent shapes, and the like), and may be predetermined by techniques such as using AIMS (aerial image measurement system) to make direct aerial image measurements of the test mask (which results are shown in FIG. 7). While direct measurements with the AIMS tool is a preferred method for establishing biases because of the speed and accuracy of such a technique, other methods comprising wafer exposures and subsequent measurement of a test mask, simulations that account for the electromagnetic scattering effects (e.g., TEMPEST as described in the aforementioned article by Wong and Neureuther), or prior experience on similar patterns can also be applied with equal success. For finer design grids, wherein multiple biasing options may be available, consideration of the mask manufacturing issues (process control, stability of the chrome overhang, mask inspection for defects, and the like) in relation to the extent of the wet etch required to perform the fine adjustment of the transmission balancing, may have a strong impact on the selection of the bias value.

While the preferred method of performing the coarse adjustment biases is through the application of an automated CAD system which may include sophisticated pattern-dependent correction schemes analogous to optical proximity correction (OPC) algorithms, another embodiment includes the design manipulation occurring via manual designer intervention, such as may be the case of a DRAM cell pattern, wherein a single instance of a pattern is hierarchically replicated many times across the mask.

With regard to the fine adjustment procedure, the preferred implementation of the etch-back process uses an isotropic immersion etch. In it, the quartz substrate etches uniformly in all directions, the chrome film is not attacked, and reasonable process control through variation of the etch time is achievable. The application of a solution such as (but not limited to) diluted HF is capable of meeting these requirements. In the preferred embodiment of this invention, an iterative procedure is used for the wet-etch step in order to achieve the maximum degree of transmission balancing and the AIMS tool is used to provide feedback of the transmission error between iterations such as demonstrated in the three-step fine-tuning process of FIG. 7. With sufficient process control and/or prior experience wherein the desired etch-back depth is well known, a single etch-back step with no feedback can also be applied. In other embodiments of the iterative procedure, alternative feedback measurements besides the AIMS tool are possible such as from direct measurement of exposed wafers.

While the preferred embodiment has been described with reference to an initial mask blank comprised of a transparent substrate coated with an opaque layer, in another embodiment of this invention, one or more layers are included as part of the mask blank between the transparent substrate and the opaque layer as exemplified by the approach described in the aforementioned article by Chieu et al.

Figure 1A:
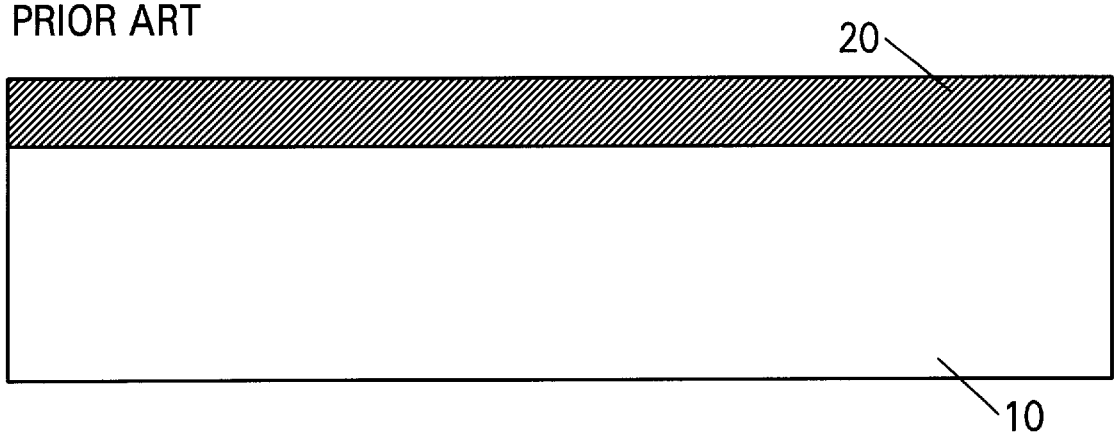
FIGS. 1a–1c show a sequence of prior art mask fabrication steps for a standard chrome-on-glass mask.
Figure 1B:
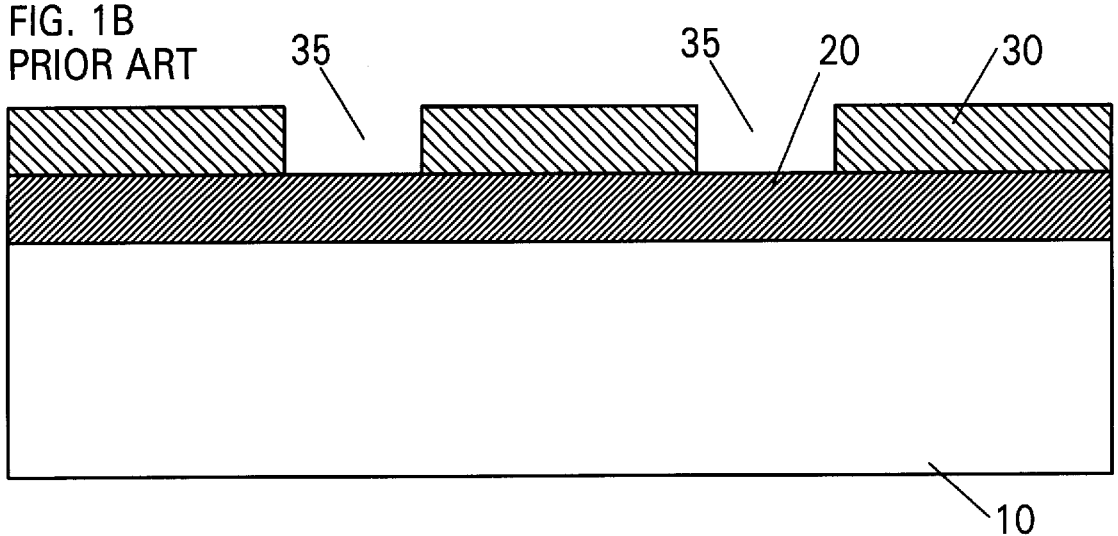
Figure 1C:
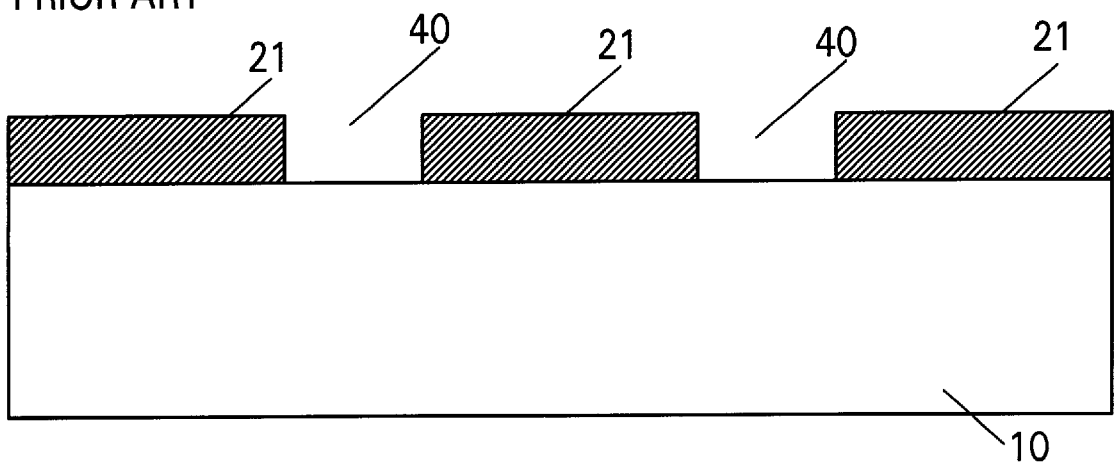
Figure 2A:
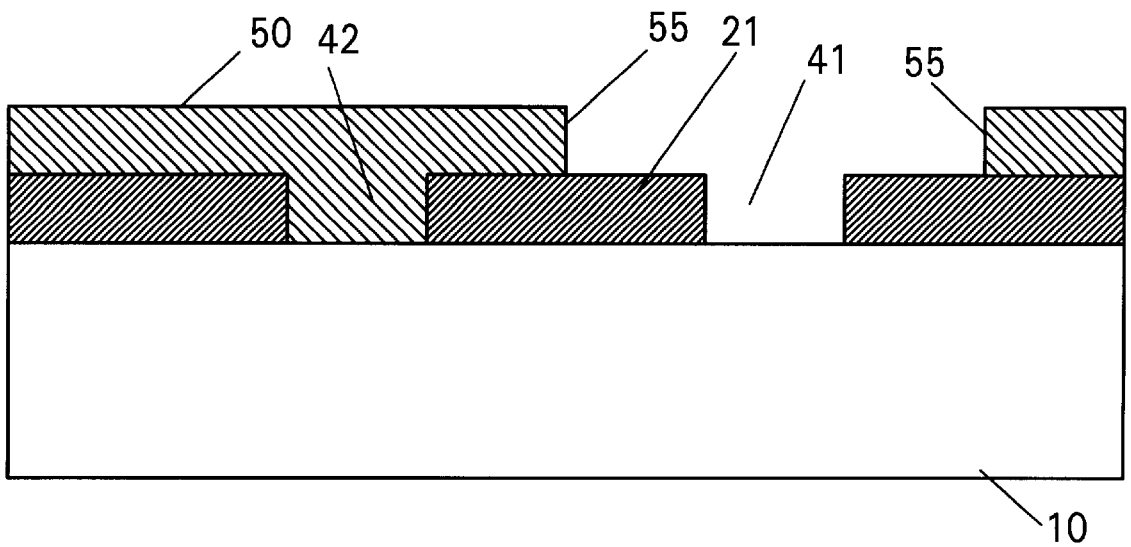
FIGS. 2a–2b show another sequence of prior art mask fabrication steps of an etched-quartz alternating PSM.
Figure 2B:
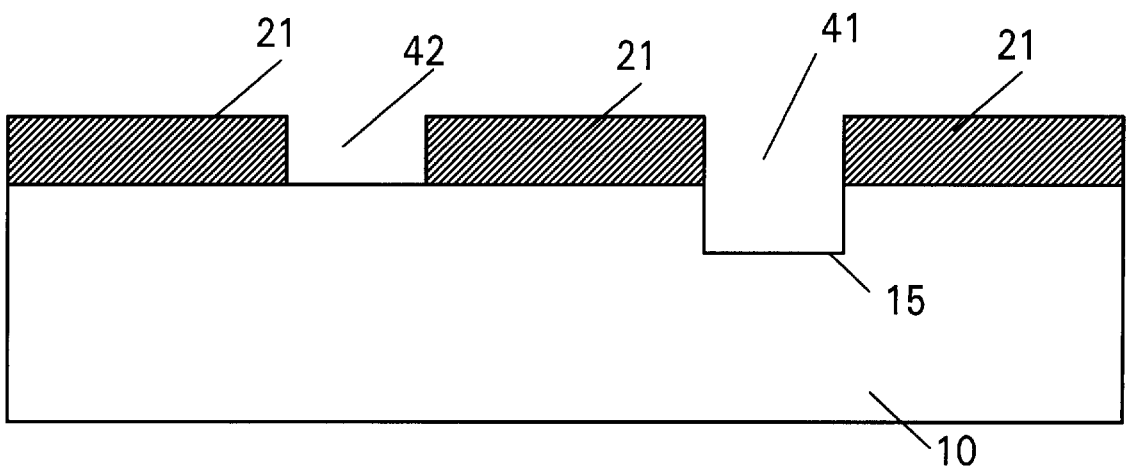
Figure 3A:
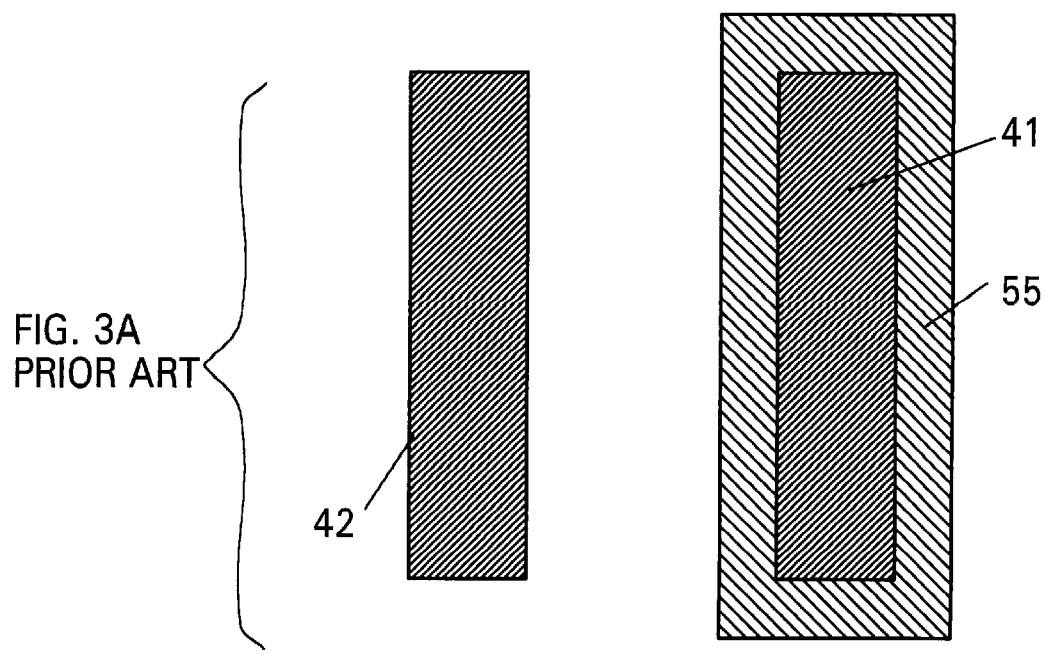
FIG. 3a shows representative alternating PSM design data for a prior art dark-field design.
Figure 3B:
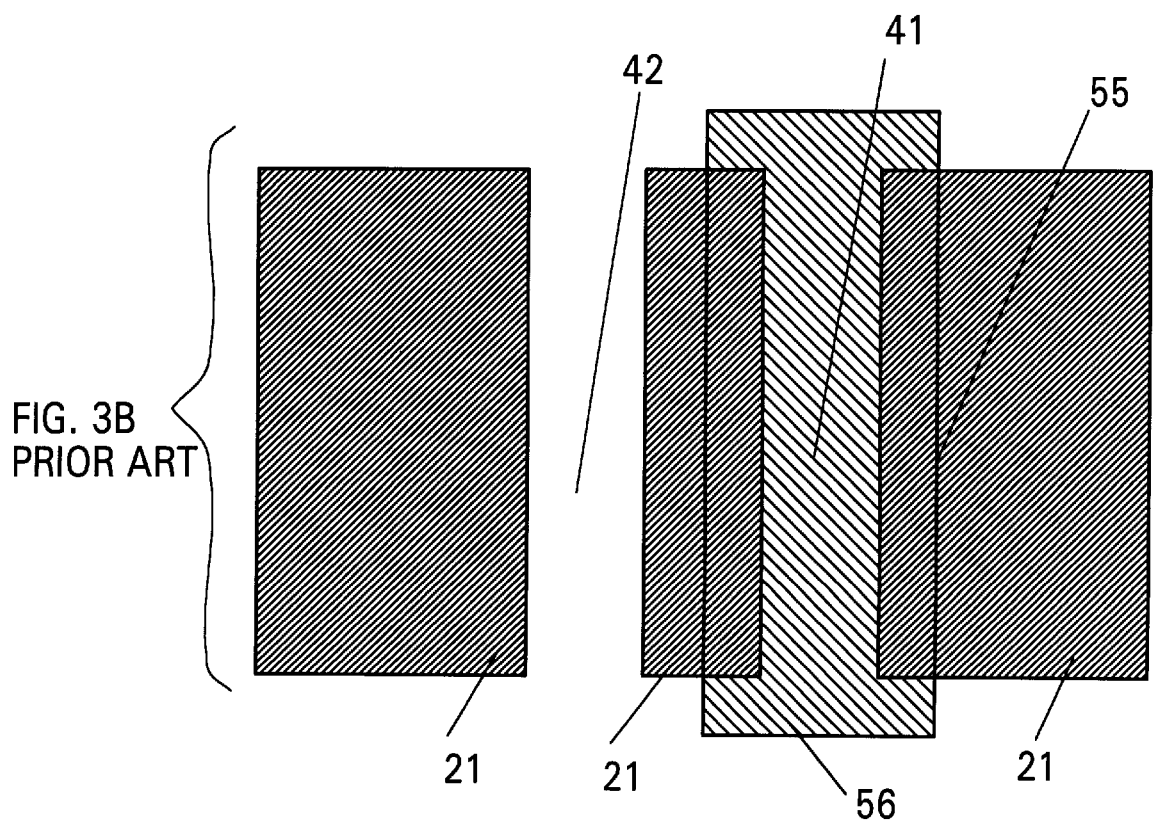
FIG. 3b shows representative alternating PSM design data for a prior art bright-field design.

In the etch-back process assumed for the schematic of FIG. 6, both the phase-shifted 41 and non-phase-shifted 42 openings are equally subjected to the isotropic etch such that the phase relationship established by the initial anisotropic etch of the quartz (depth of etched-quartz trench 15 in FIG. 2B) is maintained. This method is expected to provide the tightest phase control as well as the easiest implementation for direct feedback measurements (if the phase-shifted and non-phase-shifted features need to be processed differently during the etch back, the resist 50 of FIG. 2A may need to be selectively patterned between each feedback measurement).

Figure 9:
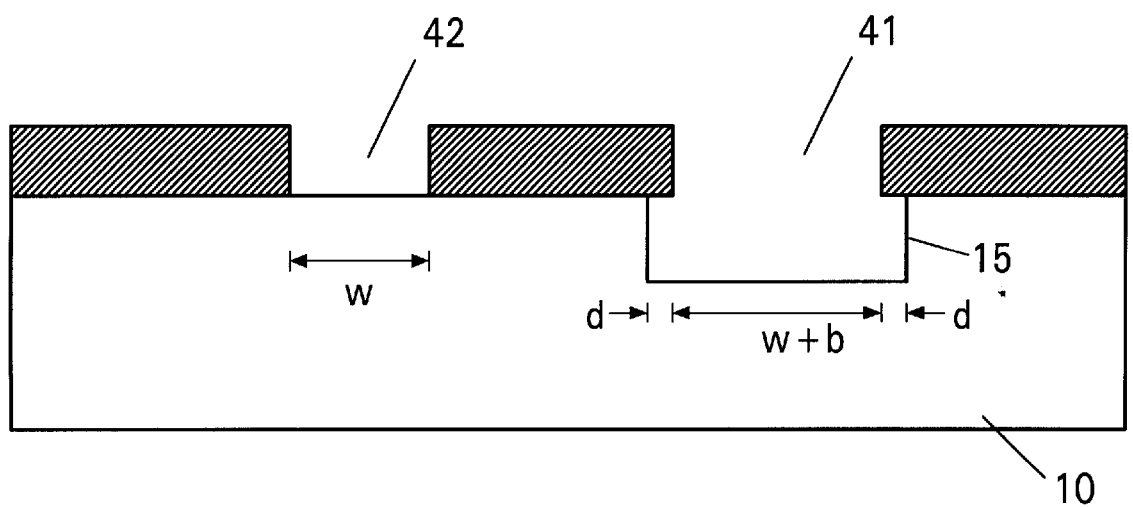
FIG. 9 shows a schematic cross section of an alternating PSM as fabricated in accordance with the present invention in which the etch-back process is applied to the phase-shifted pattern only.

Another embodiment of this invention is illustrated in FIG. 9. Similar results can be obtained by either selectively applying the etch-back process only to the phase-shifted patterns 41 or by using a single, partially-anisotropic etch, which not only establishes the depth of the etched-quartz trench 15 of the phase-shifted opening 41, but also the etch-back depth "d" simultaneously.

While this invention has been described with reference to preferred embodiments thereof, it is to be understood that the method of the invention is not limited to the precise details and conditions disclosed and that various changes and modifications, may be made without departing from the spirit of the invention which is defined by the claims that follow.

What is claimed is:

1. A method of eliminating pattern size and placement inaccuracies caused by errors in the relative amount of light transmitted through transparent features of different phase on a phase-shifted photomask, the method comprising the steps of:

building design data of said photomask representing pattern size, shape, placement and phase of said transparent features;

modifying said design data by altering the size or shape of at least one of said phase-shifted features;

fabricating said photomask with said modified design data by forming opaque and transparent features of said photomask and selectively etching transparent material of said photomask to a depth which establishes the phases of said transparent phase-shifted features, thereby partially reducing said transmission errors; and subjecting said photo-mask to an etch-back process comprising adjusting edge locations of said transparent material within said etched features in relation to edge locations of said opaque film of said photomask to a position wherein residual transmission errors between said features having a different phase on said photomask are corrected, thereby eliminating said residual transmission errors that were not previously corrected by a combination of said design data modification step and said fabrication step.

2. The method of claim 1, wherein non-phase-shifted phases and 180° phases are present in said design data.

3. The method of claim 1, wherein 90° and 270° phases are present in said design data.

4. The method of claim 1, wherein at least two phases are present in the said design data.

5. The method of claim 1, wherein said design data comprises dark-field patterns.

6. The method of claim 1, wherein said design data comprises bright-field patterns.

7. The method of claim 1, further comprising the step of selecting the magnitude of said design modifications for minimizing said transmission error prior to said etch-back process.

8. The method of claim 1, further comprising the step of selecting the magnitude of said design modifications for optimizing process control and yield during said fabrication of said photomask, and further comprising the step of positioning edge locations of said transparent material during said etch-back process.

9. The method of claim 1, wherein said design modifications are determined by software tools.

10. The method of claim 1, wherein said design modifications are selected to optimize the process control and improve the yield achieved during the photolithographic patterning of said photomask.

11. The method of claim 1, wherein said design modifications include corrections for optical proximity effects.

12. The method of claim 1, wherein all edges of said phase-shifted feature are moved independently in accordance with said changes to the size or shape of said phase-shifted feature during said design modifications.

13. The method of claim 12, wherein said movements of said edges of said phase-shifted features are selected based upon the shape and size of said phase-shifted feature.

14. The method of claim 12, wherein said movements of said edges of said phase-shifted features are selected based upon distance, size, shape, and phase of at least one neighboring feature to said phase-shifted feature.

15. The method of claim 1, wherein said etch-back process further comprises at least one step after which measurements of said residual transmission errors are taken in order to minimize said residual transmission errors at the completion of said at least one step.

16. The method of claim 15, wherein said measurements of said residual transmission errors are made by direct aerial image measurements of said photomask with an optical system configured to emulate the usage of said photomask during photolithographic patterning.

17. The method of claim 16, wherein said direct aerial image measurements of said photomask are provided by an aerial image measurements system (AIMS).

18. The method of claim 15, wherein said measurements of said residual transmission errors are made by photolithographic patterning of said photomask onto a wafer substrate and a subsequent characterization of said patterns obtained on said wafer substrate from said photolithographic patterning.

19. The method of claim 1, wherein said etch-back process is applied non-selectively to all of said features defined in said design data.

20. The method of claim 1, wherein said etch-back process is applied to a subset of said features in said design with predetermined characteristics that include size, shape, neighboring features, and phase.

21. The method of claim 1, wherein said etch-back process is incorporated into said selective etching of said transparent material by including an isotropic component to said selective etch.

22. A method of eliminating pattern size and placement inaccuracies caused by errors in the relative amount of light transmitted through transparent features of different phase on a phase-shifted photomask, the method comprising the steps of:

building design data of said photomask representing pattern size, shape, placement and phase of said transparent features;

selectively biasing said design data, said biasing including altering the size or shape of at least one of said phase-shifted features;

fabricating said photomask with said modified design data, forming opaque and transparent features of said photomask and selectively etching transparent material of said photomask to a depth which establishes the phases of said transparent phase-shifted features, said selective biasing of said design data coupled to said fabricating said photomask with said modified design data providing a first reduction of said transmission errors between said features; and subjecting said photo-mask to an etch-back process comprising adjusting edge locations of said transparent material within said etched features in relation to edge locations of said opaque film of said photomask to a position, wherein residual transmission errors between said features having a different phase on said photomask that were not previously corrected by a combination of said design data modification step and said fabrication step are eliminated.

* * * * *